United States Patent
Wu et al.

(10) Patent No.: US 11,682,714 B2
(45) Date of Patent: *Jun. 20, 2023

(54) INNER SPACER FEATURES FOR MULTI-GATE TRANSISTORS

(71) Applicant: Taiwan Semiconductor Manufacturing Co., Ltd., Hsinchu (TW)

(72) Inventors: Bone-Fong Wu, Hsinchu (TW); Chih-Hao Yu, Tainan (TW); Chia-Pin Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/706,296

(22) Filed: Mar. 28, 2022

(65) Prior Publication Data

US 2022/0223718 A1 Jul. 14, 2022

Related U.S. Application Data

(63) Continuation of application No. 16/937,164, filed on Jul. 23, 2020, now Pat. No. 11,289,584.

(Continued)

(51) Int. Cl.
*H01L 29/66* (2006.01)
*H01L 29/06* (2006.01)
(Continued)

(52) U.S. Cl.
CPC .... *H01L 29/66553* (2013.01); *H01L 29/0653* (2013.01); *H01L 29/42392* (2013.01);
(Continued)

(58) Field of Classification Search
CPC ............. H01L 21/0214; H01L 21/0228; H01L 21/02603; H01L 21/28141;
(Continued)

(56) References Cited

U.S. PATENT DOCUMENTS 8,963,258 B2 2/2015 Yu et al.
9,818,872 B2 11/2017 Ching et al.
(Continued)

FOREIGN PATENT DOCUMENTS

KR 20190056907 A 5/2019

*Primary Examiner* — David C Spalla
(74) *Attorney, Agent, or Firm* — Haynes and Boone, LLP

(57) ABSTRACT

A semiconductor device according to the present disclosure includes a channel member including a first connection portion, a second connection portion and a channel portion disposed between the first connection portion and the second connection portion, a first inner spacer feature disposed over and in contact with the first connection portion, a second inner spacer feature disposed under and in contact with the first connection portion, and a gate structure wrapping around the channel portion of the channel member. The channel member further includes a first ridge on a top surface of the channel member and disposed at an interface between the channel portion and the first connection portion. The first ridge partially extends between the first inner spacer feature and the gate structure.

20 Claims, 16 Drawing Sheets

Related U.S. Application Data

(60) Provisional application No. 63/015,198, filed on Apr. 24, 2020.

(51) Int. Cl.
*H01L 29/423* (2006.01)
*H01L 29/78* (2006.01)
*H01L 21/02* (2006.01)

(52) U.S. Cl.
CPC ...... *H01L 29/6653* (2013.01); *H01L 29/6656* (2013.01); *H01L 29/6681* (2013.01); *H01L 29/7853* (2013.01); *H01L 21/0214* (2013.01); *H01L 21/0228* (2013.01)

(58) Field of Classification Search
CPC ..... H01L 21/823431; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/41791; H01L 29/72392; H01L 29/66439; H01L 29/6653; H01L 29/66553; H01L 29/6656; H01L 29/66795; H01L 29/6681; H01L 29/775; H01L 29/785; H01L 29/7851; H01L 29/7853; H01L 29/7855; H01L 2029/7858

See application file for complete search history.

(56) References Cited

U.S. PATENT DOCUMENTS

| | | | |
|---|---|---|---|
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 * | 10/2018 | Lin | H01L 29/66545 |
| 10,157,799 B2 | 12/2018 | Ching et al. | |
| 10,199,502 B2 | 2/2019 | Huang et al. | |
| 10,290,546 B2 * | 5/2019 | Chiang | H01L 29/78651 |
| 10,475,902 B2 | 11/2019 | Lee et al. | |
| 11,289,584 B2 * | 3/2022 | Wu | H01L 29/6653 |
| 2018/0175036 A1 | 6/2018 | Ching et al. | |
| 2019/0131431 A1 | 5/2019 | Cheng et al. | |
| 2019/0157444 A1 | 5/2019 | Yang et al. | |
| 2019/0198645 A1 * | 6/2019 | Cheng | H01L 29/66439 |
| 2020/0058800 A1 | 2/2020 | Wang | |
| 2020/0105929 A1 | 4/2020 | Zhang | |
| 2020/0286992 A1 * | 9/2020 | Song | H01L 29/0673 |
| 2020/0357911 A1 * | 11/2020 | Frougier | H01L 29/42392 |

* cited by examiner

INNER SPACER FEATURES FOR MULTI-GATE TRANSISTORS

PRIORITY DATA

This application is a continuation application of U.S. patent application Ser. No. 16/937,164, filed Jul. 23, 2020, which claims priority to U.S. Provisional Patent Application No. 63/015,198 filed on Apr. 24, 2020, entitled "INNER SPACER FEATURES FOR MULTI-GATE TRANSISTORS", each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Inner spacer features have been implemented in MBC transistors to space a gate structure away from an epitaxial source/drain feature. The design of inner spacer features needs to strike a difficult balance between having sufficient etch resistance and maintaining a low dielectric constant. With respect to the former, the inner spacer feature needs to resist the etch process of the sacrificial layers to prevent damages to the source/drain features. With respect to the latter, etch resistant dielectric material tends to have higher-than-desirable dielectric constant and the higher dielectric constant may lead to increased parasitic capacitance between the gate structure and the source/drain features. Therefore, while conventional inner spacer features may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
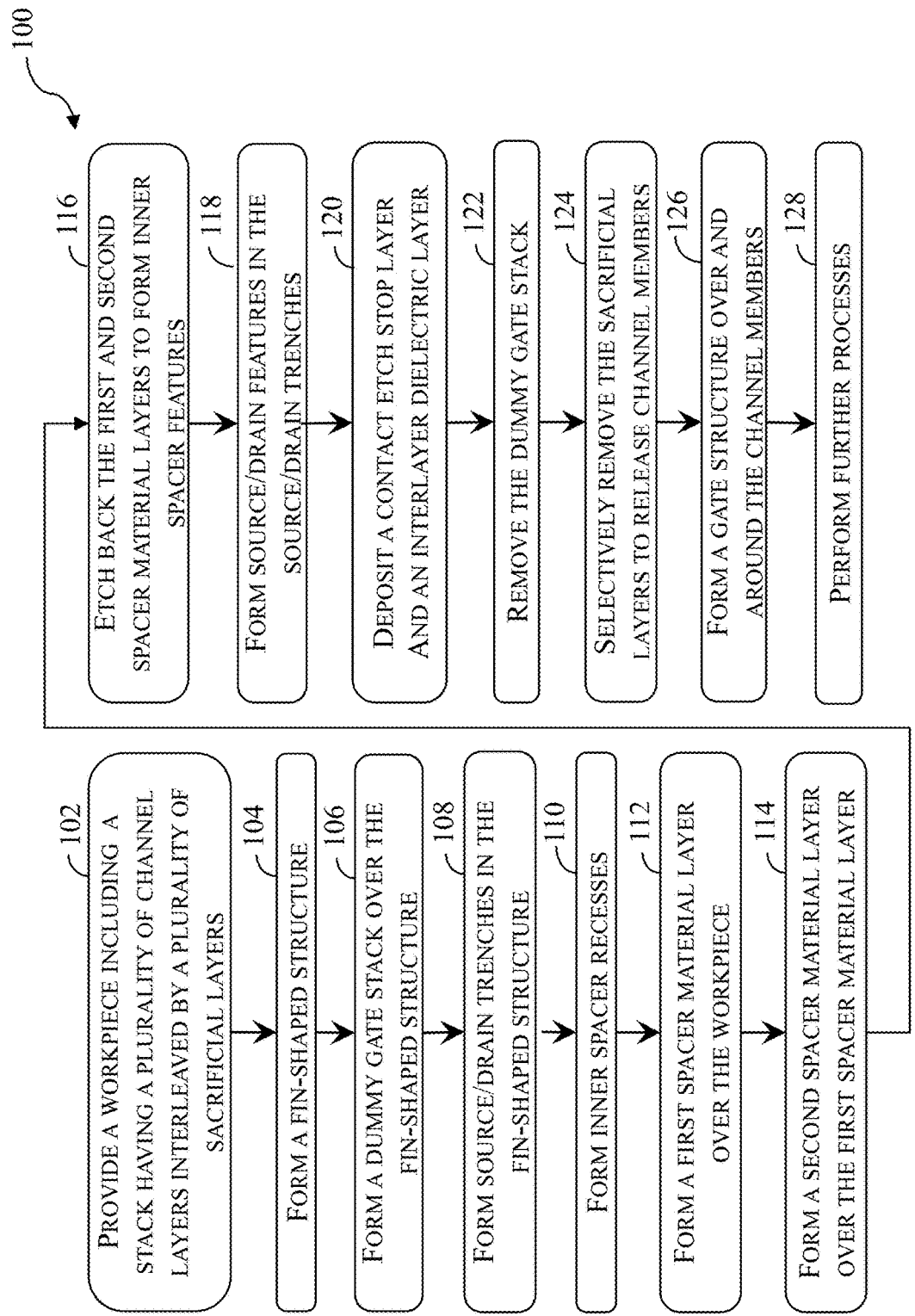
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer features of an MBC transistor.

As described above, MBC transistors may also be referred to as SGTs, GAA transistors, nanosheet transistors, or nanowire transistors. They can be either n-type or p-type. MBC devices according to the present disclosure may have channel regions disposed in nanowire channel members, bar-shaped channel members, nanosheet channel members, nanostructure channel members, bridge-shaped channel members, and/or other suitable channel configurations. Inner spacer features have been implemented between channel members to isolate a gate structure from a source/drain feature. Inner spacer features cap two ends of sacrificial layers and during the channel release process, inner spacer features contain the etching to the sacrificial layers and prevent source/drain features from being damaged. For that reason, ideal inner spacer features should have sufficient etch resistance such that it can slow down the etching process for removing the sacrificial layers. As a dielectric constant of a dielectric material is a reliable proxy of its etch resistance, a dielectric material with good etch resistance tends to have a greater dielectric constant. Other concerns prevent use of high dielectric constant (high-k) materials. For example, inner spacer features formed of high dielectric constant (high-k) dielectric material may lead to higher parasitic capacitance between the gate structure and the source/drain feature. A search for a dielectric material with a highly etch-resistant and a low dielectric constant has not yielded any promising result yet and the industry has been exploring various alternative solutions.

The present disclosure provides embodiments of a semiconductor device. The semiconductor device includes a plurality of channel members extending between two source/drain features. Each of the channel members is divided into a channel portion wrapped around by a gate structure and a connection portion sandwiched either between a gate spacer layer and an inner spacer feature or between two inner spacer features. An inner spacer feature according to the present disclosure includes an inner layer and an outer layer. A dielectric constant of the outer layer is greater than a dielectric constant of the inner layer. The outer layer and the inner layer may include silicon, carbon, oxygen, and nitrogen. An oxygen content of the outer layer is smaller than an oxygen content of the inner layer and a nitrogen content of the outer layer is greater than a nitrogen content of the inner layer. A portion of the outer layer facing the gate structure may be etched away along with the sacrificial layers such that the gate structure is in contact with the inner layer. The channel members of the present disclosure may not be straight. In some implementations, a channel member may include a first ridge and an opposing second ridge at the interface between an inner spacer feature and the gate structure. In some instances, the first and second ridge may partially extend between the inner spacer feature and the gate structure. With the outer layer, the inner spacer features of the present disclosure may have sufficient etch resistance to prevent damages to the source/drain features. The portion of the outer layer between the source/drain feature and the gate structure may be removed. Because the dielectric constant of the inner layer is smaller than that of the outer layer, the removal of the portion of the outer layer may reduce parasitic capacitance and improve device performance.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with fragmentary cross-sectional views of the workpiece at different stages of fabrication according to embodiments of method 100.

Figure 2:
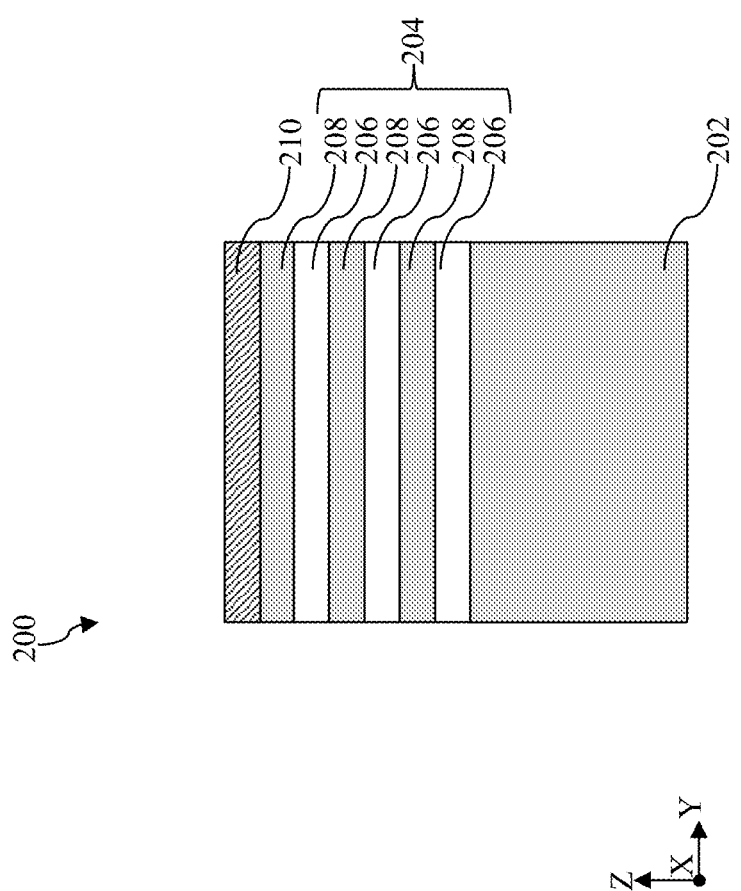
FIGS. 2-15 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. It is noted that because the workpiece 200 will be fabricated into a semiconductor device, the workpiece 200 may also be referred to as the semiconductor device 200 as the context requires. The workpiece 200 may include a substrate 202. Although not explicitly shown in the figures, the substrate 202 may include an n-type well region and a p-type well region for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For avoidance of doubts, the X direction, the Y direction and the Z direction are perpendicular to one another.

Figure 3:
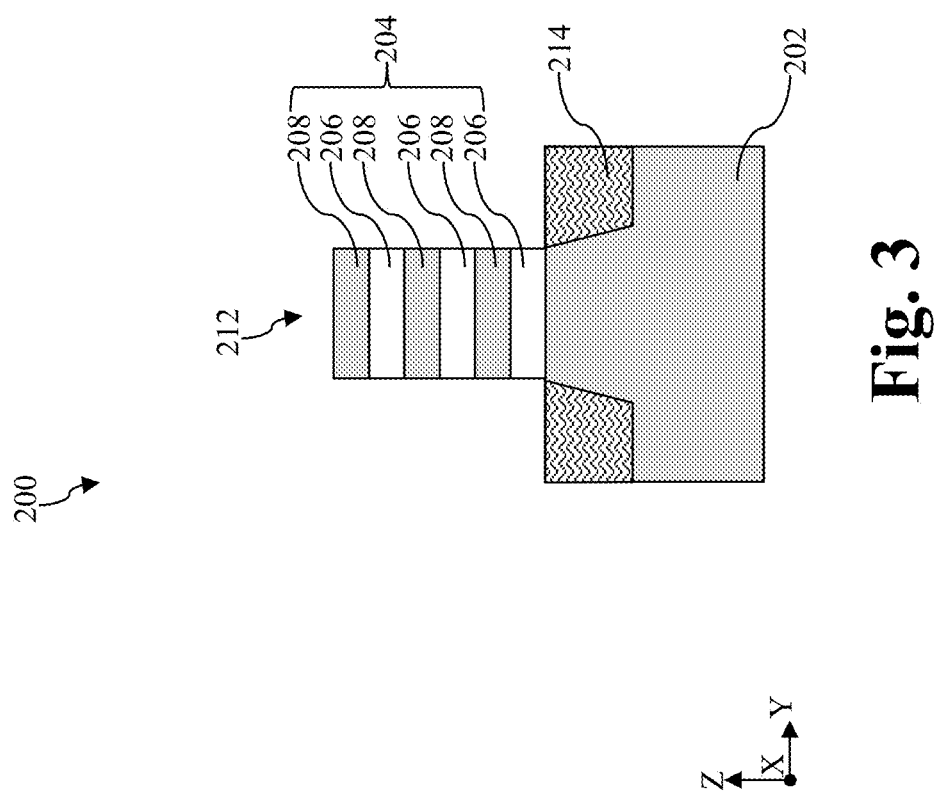

As shown in FIG. 2, the workpiece 200 also includes a stack 204 disposed over the substrate 202. The stack 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. Suitable epitaxial processes include vapor-phase epitaxy (VPE), ultra-high vacuum chemical vapor deposition (UHV-CVD), molecular beam epitaxy (MBE), and/or other suitable processes. As shown in FIG. 2, the sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIG. 3, which are for illustrative purposes only and not intended to be limiting beyond what is specifically recited in the claims. It can be appreciated that any number of sacrificial layers and channel layers can be formed in the stack 204. The number of layers depends on the desired number of channels members for the device 200. In some embodiments, the number of channel layers 208 is between 2 and 10. For patterning purposes, a hard mask layer 210 may be deposited over the stack 204. The hard mask layer 210 may be a single layer or a multilayer. In one example, the hard mask layer 210 includes a silicon oxide layer and a silicon nitride layer.

Referring to FIGS. 1 and 3, method 100 includes a block 104 where a fin-shaped structure 212 is formed from the stack 204. In some embodiments, the stack 204 and a portion of the substrate 202 are patterned to form the fin-shaped structure 212. As shown in FIG. 3, the fin-shaped structure 212 extends vertically along the Z direction from the substrate 202. The fin-shaped structure 212 includes a base portion formed from the substrate 202 and a stack portion formed from the stack 204. The fin-shaped structure 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204 and the substrate 202. The etching process can include dry etching, wet etching, reactive ion etching (RIE), and/or other suitable processes.

As shown in FIG. 3, operations at block 104 also include formation of an isolation feature 214 adjacent and around the base portion of the fin-shaped structure 212. The isolation feature 214 is disposed between the fin-shaped structure 212 and another fin-shaped structure 212. The isolation feature 214 may also be referred to as a shallow trench isolation (STI) feature 214. In an example process, a dielectric layer is first deposited over the workpiece 200, filling the trenches between the fin-shaped structure 212 and a neighboring fin-shaped structure with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an atomic layer deposition (ALD) process, a physical vapor deposition (PVD) process, spin-on coating, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the isolation feature 214. As shown in FIG. 3, the stack portion of the fin-shaped structure 212 rises above the isolation feature 214. Although not explicitly shown in FIG. 3, the hard mask layer 210 may also be removed during the formation of the isolation feature 214.

Figure 4:
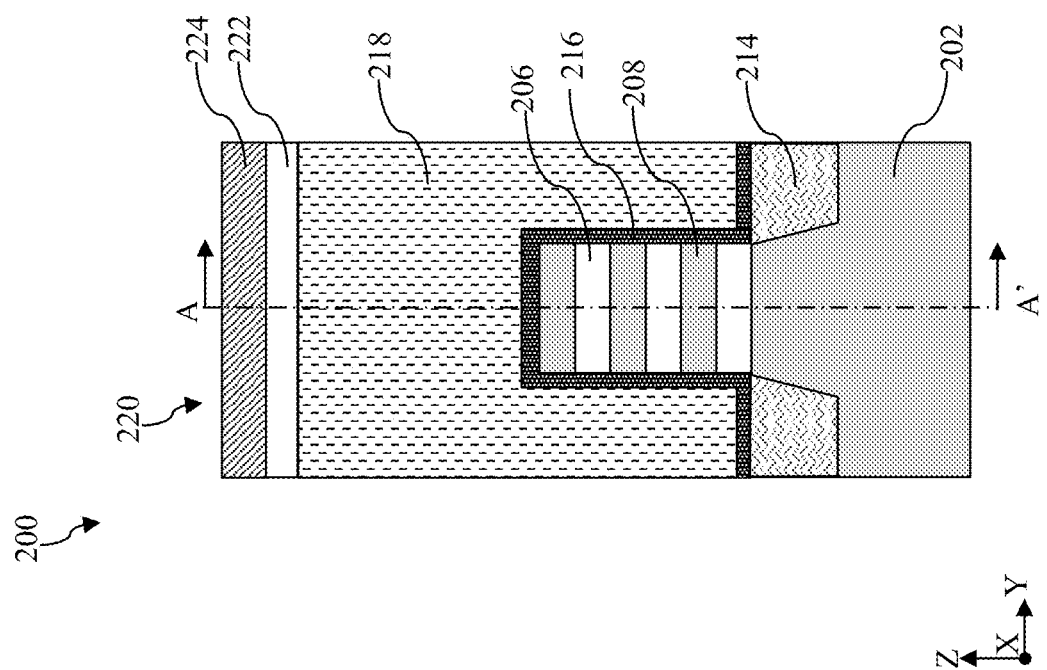
Figure 5:
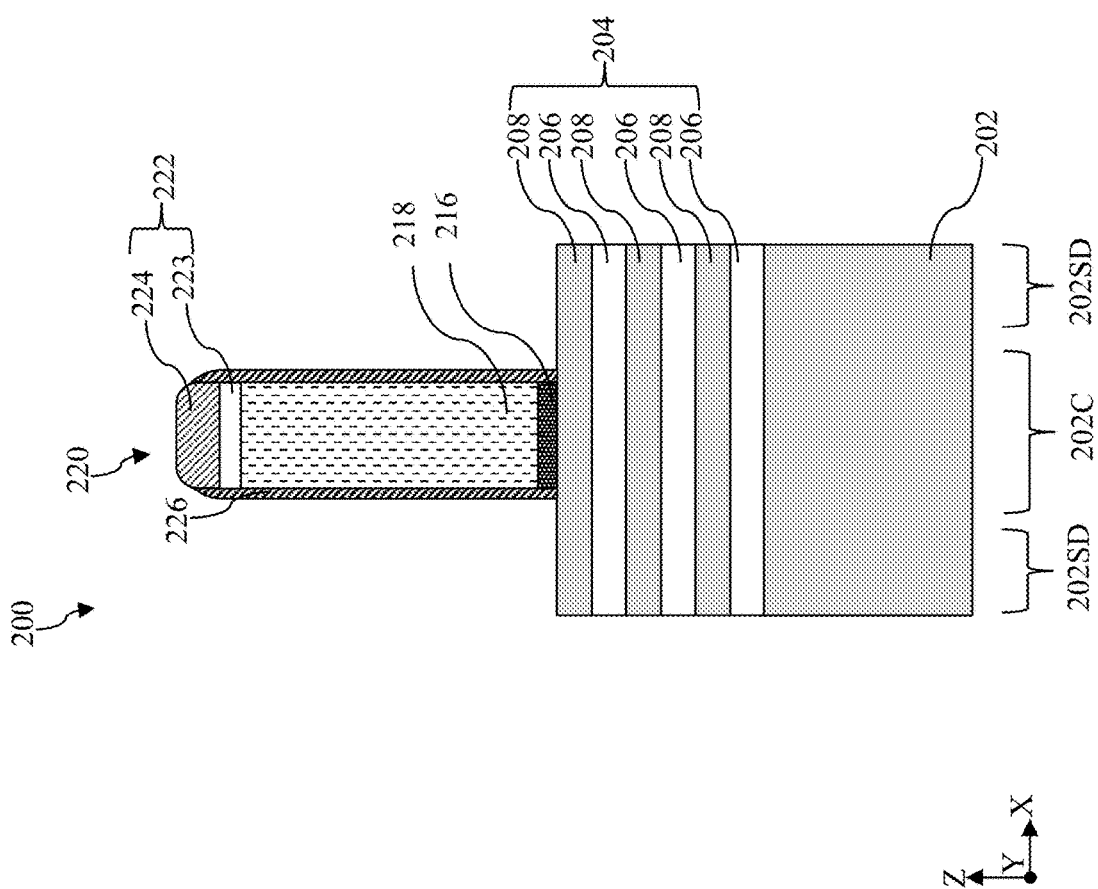

Referring to FIGS. 1, 4 and 5, method 100 includes a block 106 where a dummy gate stack 220 is formed over the fin-shaped structure 212. In some embodiments, a gate replacement process (or gate-last process) is adopted where the dummy gate stack 220 serves as placeholders for a functional gate structure. Other processes and configuration are possible. In some embodiments, the dummy gate stack 220 is formed over the isolation feature 214 and is at least partially disposed over the fin-shaped structures 212. As shown in FIG. 4, the dummy gate stack 220 extends lengthwise along the Y direction to wrap over the fin-shaped structure 212. The dummy gate stack 220 includes a dummy dielectric layer 216 and a dummy gate electrode 218. To illustrate how the dummy gate stack 220 is disposed over the fin-shaped structure 212, a cross-sectional view along the cross-section A-A' is provided in FIG. 5. As shown in FIG. 5, the portion of the fin-shaped structure 212 underlying the dummy gate stack 220 is a channel region 202C. The channel region 202C and the dummy gate stack 220 also define source/drain regions 202SD that are not vertically overlapped by the dummy gate stack 220. The channel region 202C is disposed between two source/drain regions 202SD. It is noted that because the cross-sectional view in FIG. 5 slices through the fin-shaped structure 212, the isolation feature 214 is not shown in FIG. 5.

In some embodiments, the dummy gate stack 220 is formed by various process steps such as layer deposition, patterning, etching, as well as other suitable processing steps. Exemplary layer deposition processes include low-pressure CVD (LPCVD), CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In an example process, the dummy dielectric layer 216, a dummy electrode layer for the dummy gate electrode 218, and a gate top hard mask layer 222 are sequentially deposited over the workpiece 200, including over the fin-shaped structure 212. In some instances, the gate top hard mask layer 222 may be a multilayer and may include a first hard mask 223 and a second hard mask 224 over the first hard mask 223. The first hard mask 223 may include silicon oxide and the second hard mask 224 may include silicon nitride. The deposition may be done by using one of the aforementioned exemplary layer deposition processes. The dummy dielectric layer 216 and the dummy electrode layer are then patterned using photolithography processes to form the dummy gate stack 220. In some embodiments, the dummy dielectric layer 216 may include silicon oxide and the dummy gate electrode 218 may include polycrystalline silicon (polysilicon).

After the formation of the dummy gate stack 220, a gate spacer layer 226 is formed alongside sidewalls of the dummy gate stack 220. In some embodiments, the formation of the gate spacer layer 226 includes conformal deposition of one or more dielectric layers over the workpiece 200 and etch-back of the gate spacer layer 226 from top-facing surfaces of the workpiece 200. In an example process, the one or more dielectric layers are deposited using CVD, SACVD, or ALD and are etched back in an anisotropic etch process to form the gate spacer layer 226. The gate spacer layer 226 may include silicon oxide, silicon nitride, silicon carbide, silicon oxynitride, silicon carbonitride, silicon oxycarbide, silicon oxycarbonitride, and/or combinations thereof.

Figure 6:
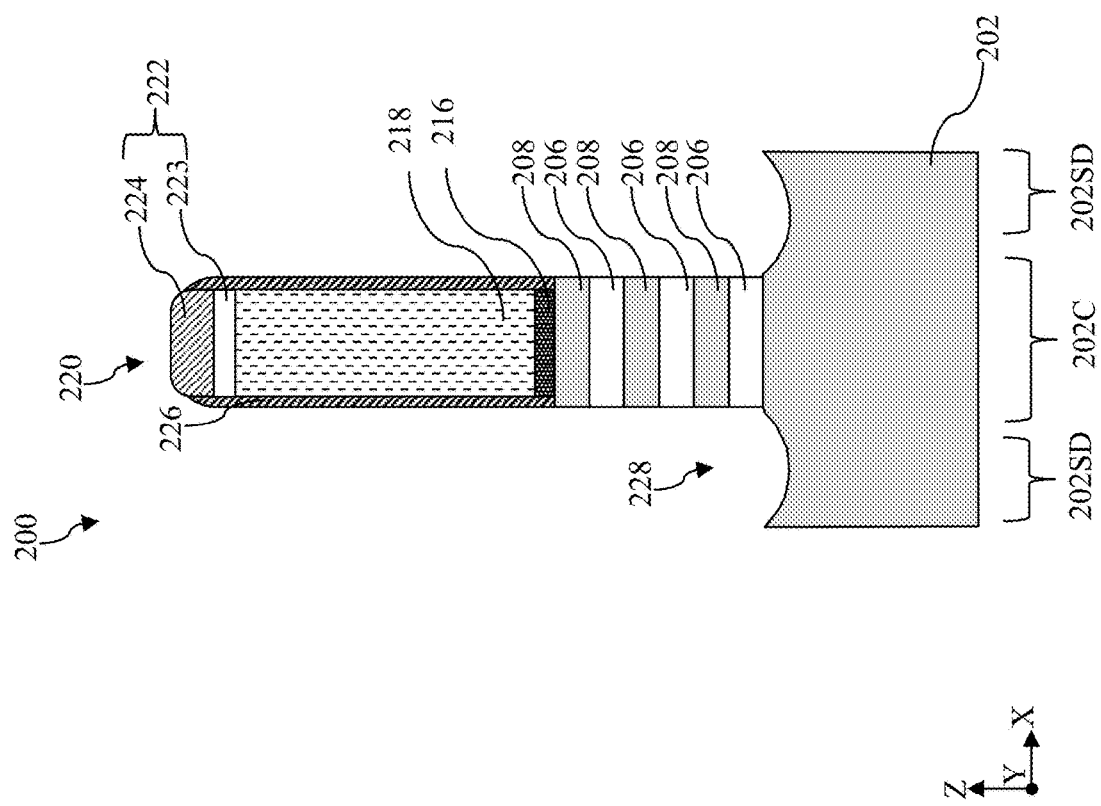

Referring to FIGS. 1 and 6, method 100 includes a block 108 where source/drain trenches 228 are formed in the fin-shaped structure 212. In embodiments represented in FIG. 6, the source/drain regions 202SD of the fin-shaped structure 212, which are not masked by the gate top hard mask layer 222 and the gate spacer layer 226, are recessed to form the source/drain trenches 228. The etch process at block 108 may be a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 6, sidewalls of the sacrificial layers 206 and the channel layers 208 are exposed in the source/drain trenches 228.

Figure 7:
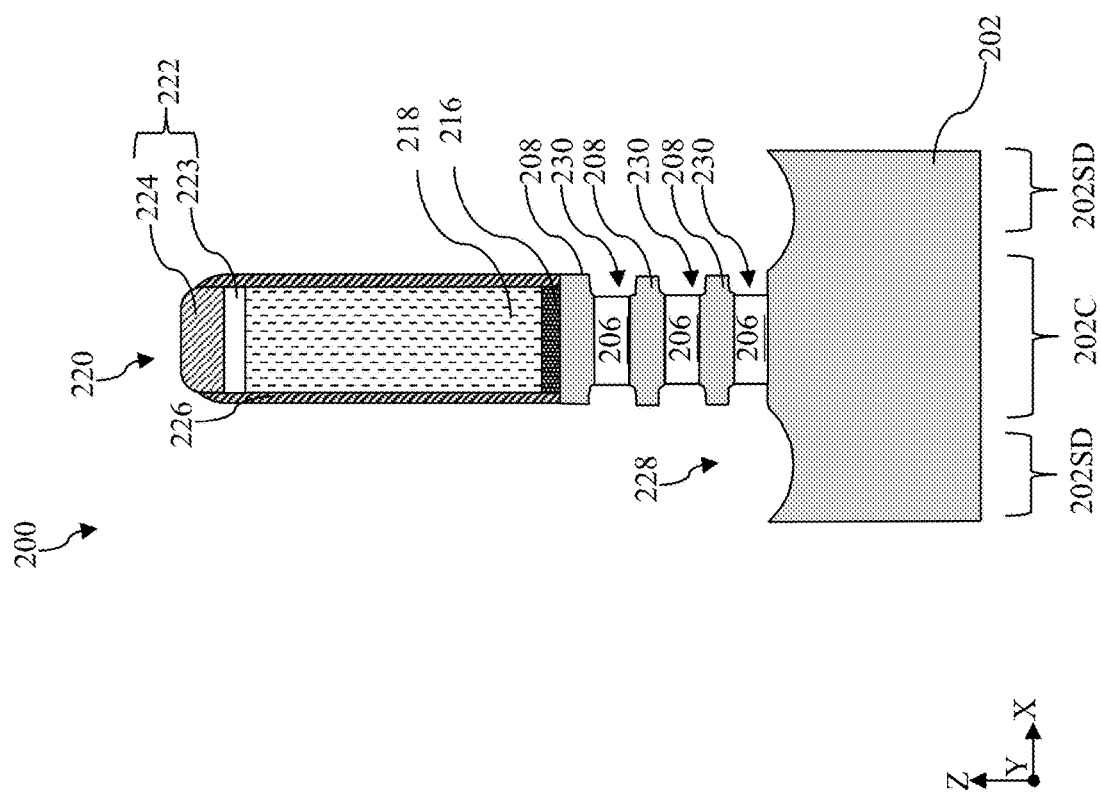

Referring to FIGS. 1 and 7, method 100 includes a block 110 where inner spacer recesses 230 are formed. At block 110, the sacrificial layers 206 exposed in the source/drain trenches 228 are selectively and partially recessed to form inner spacer recesses 230, while the exposed channel layers 208 are moderately etched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. As shown in FIG. 7, the channel layers 208 may be moderately etched at block 110 and the inner spacer recesses 230 may partially extend along the Z direction into the channel layers 208. Each of the inner spacer recesses 230 has a depth (along the X direction) between about 2 nm and about 5 nm and a height (along the Z direction) between about 7 nm and about 12 nm. Put differently, each of the inner spacer recesses 230 has a height greater than its depth.

Figure 8:
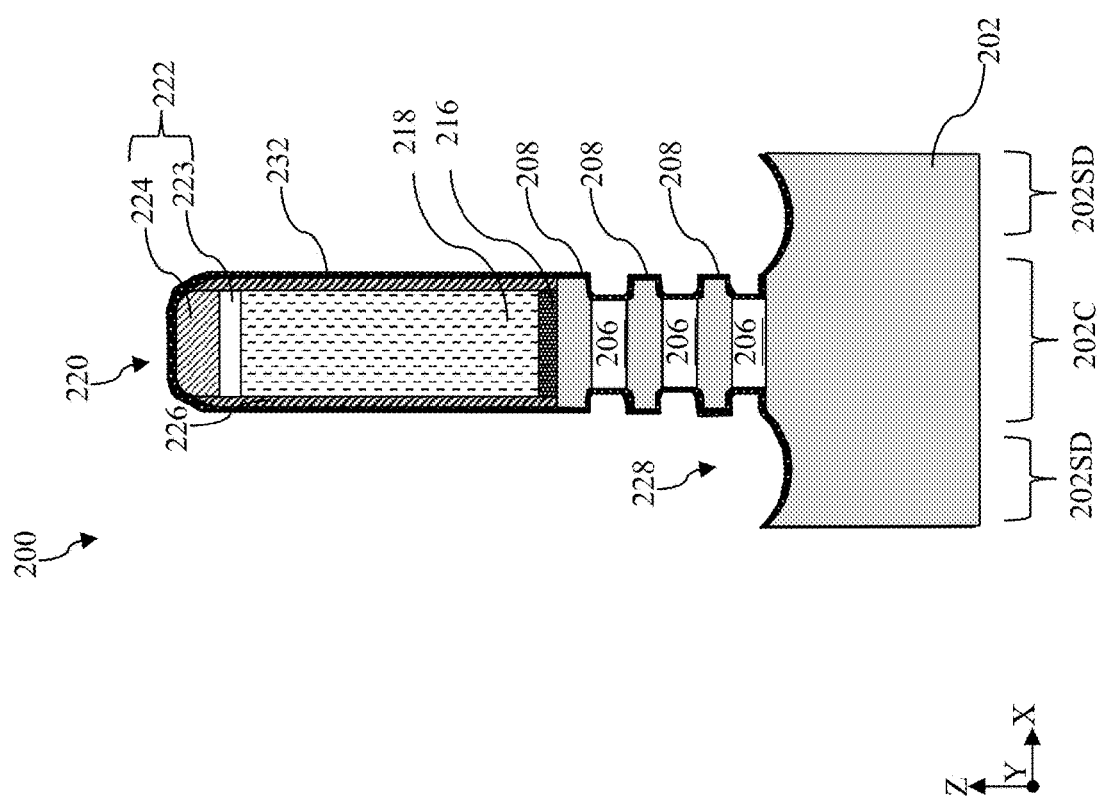

Referring to FIGS. 1 and 8, method 100 includes a block 112 where a first spacer material layer 232 is formed over the workpiece 200. The first spacer material layer 232 may be deposited using ALD and may include silicon (Si), carbon (C), oxygen (O), and nitrogen. In some embodiments, the first spacer material layer 232 may include silicon oxycarbonitride and include a silicon content between about 30% and about 50%, a carbon content between about 5% and about 15%, an oxygen content between about 5% and about 15%, and a nitrogen content between about 40% and about 60%. In some alternative embodiments, the first spacer material layer 232 may include silicon carbonitride. Because the nitrogen content is between about 40% and about 60%, the first spacer material layer 232 has a first dielectric constant between about 5 and about 8 and a first density between about 2 $g/cm^3$ and about 4 $g/cm^3$. The first spacer material layer 232 is deposited to a thickness between about 0.5 nm and about 2 nm. The thickness of the first spacer material layer 232 is selected such that it is sufficiently thick to prevent damages to the source/drain features during channel release processes and at the same time, is thin enough to be removed along with the sacrificial layers 206 after the channel release process.

Figure 9:
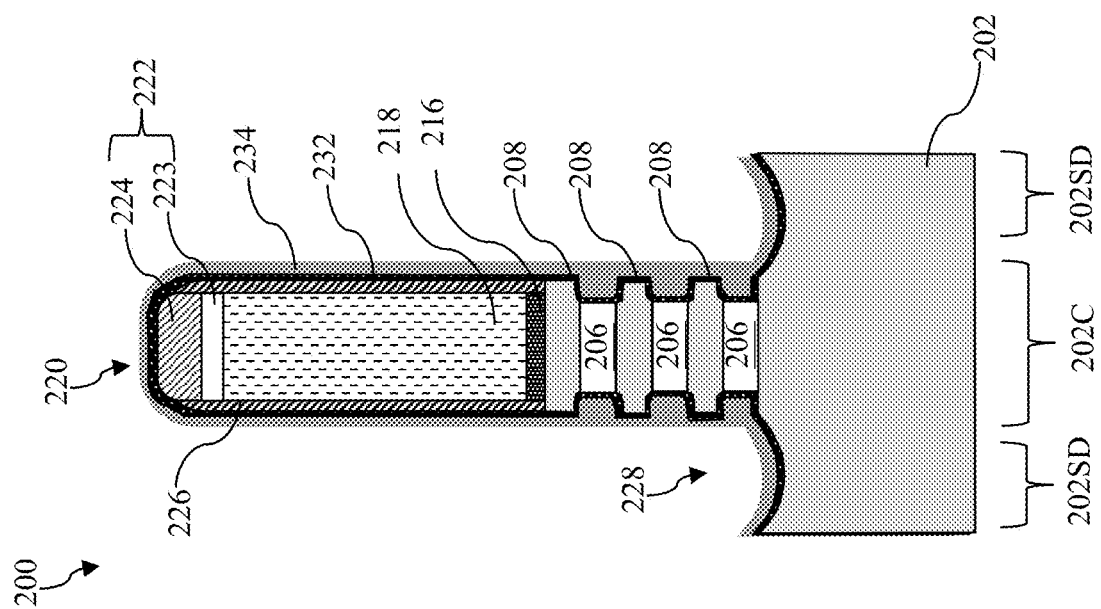

Referring to FIGS. 1 and 9, method 100 includes a block 114 where a second spacer material layer 234 is formed over the first spacer material layer 232. The second spacer material layer 234 may be deposited using ALD. Although the second spacer material layer 234 may also include silicon (Si), carbon (C), oxygen (O), and nitrogen like the first spacer material layer 232, the composition of the second spacer material layer 234 is different from the composition of the first spacer material layer 232. In some embodiments, the second spacer material layer 234 may include silicon oxycarbonitride and include a silicon content between about 30% and about 50%, a carbon content between about 5% and about 15%, an oxygen content between about 40% and about 60%, and a nitrogen content between about 10% and about 20%. In these embodiments, the oxygen content of the second spacer material layer 234 is greater than that of the first spacer material layer 232 and the nitrogen content of the second spacer material layer 234 is smaller than that of the first spacer material layer 232. In some alternative embodiments, the second spacer material layer 234 may include silicon oxycarbide, porous silicon oxycarbide, or fluorine-doped silicon oxide. Because the oxygen content is between about 40% and about 60%, the second spacer material layer 234 has a second dielectric constant between about 1.5 and about 4 and a second density between about 1 $g/cm^3$ and about 3 $g/cm^3$. As a comparison, the first dielectric constant of the first spacer material layer 232 is greater than the second dielectric constant of the second spacer material layer 234. In addition, the first density of the first spacer material layer 232 is greater than the second density of the second spacer material layer 234. The second spacer material layer 234 may be thicker than the first spacer material layer 232. In some implementations, the second spacer material layer 234 may be between about 1 nm and about 3 nm.

Figure 10:
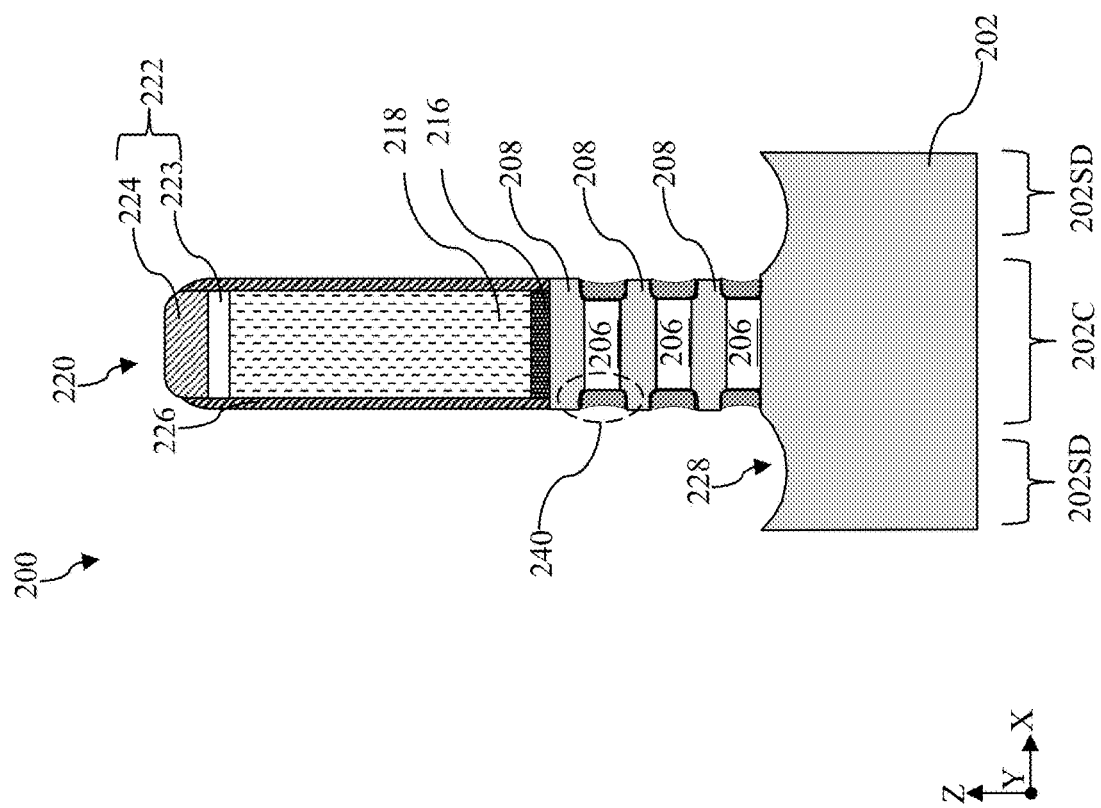

Referring to FIGS. 1 and 10, method 100 includes a block 116 where the first spacer material layer 232 and the second spacer material layer 234 are etched back to form inner spacer features 240. At block 116, the etch back process removes the first spacer material layer 232 and the second spacer material layer 234 on the channel layers 208, the substrate 202, and the gate spacer layer 226 to form the inner spacer features 240 in the inner spacer recesses 230. In some embodiments, the etch back process at block 116 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof. As described above, each of the inner spacer recesses 230 has a depth (along the X direction) between about 2 nm and about 5 nm and a height (along the Z direction) between about 7 nm and about 12 nm. Because each of the inner spacer features 240 is formed into an inner spacer recess 230, each of the inner spacer features may also have a depth (along the X direction) between about 2 nm and about 5 nm and a height (along the Z direction) between about 7 nm and about 12 nm. Put differently, each of the inner spacer features 240 has a height (along the Z direction) greater than its depth (along the X direction). As illustrated in FIG. 10, each of the inner spacer features 240 includes an outer layer formed from the first spacer material layer 232 and an inner layer formed from the second spacer material layer 234. For ease of reference, the outer layer shares the same reference numeral with the first spacer material layer 232 and the inner layer shares the same reference numeral with the second space material layer 234. Upon conclusion of the operations at block 116, the outer layer 232 hugs the inner layer 234 and spaces the inner layer 234 apart from the channel layers 208 and the sacrificial layers 206.

Figure 11:
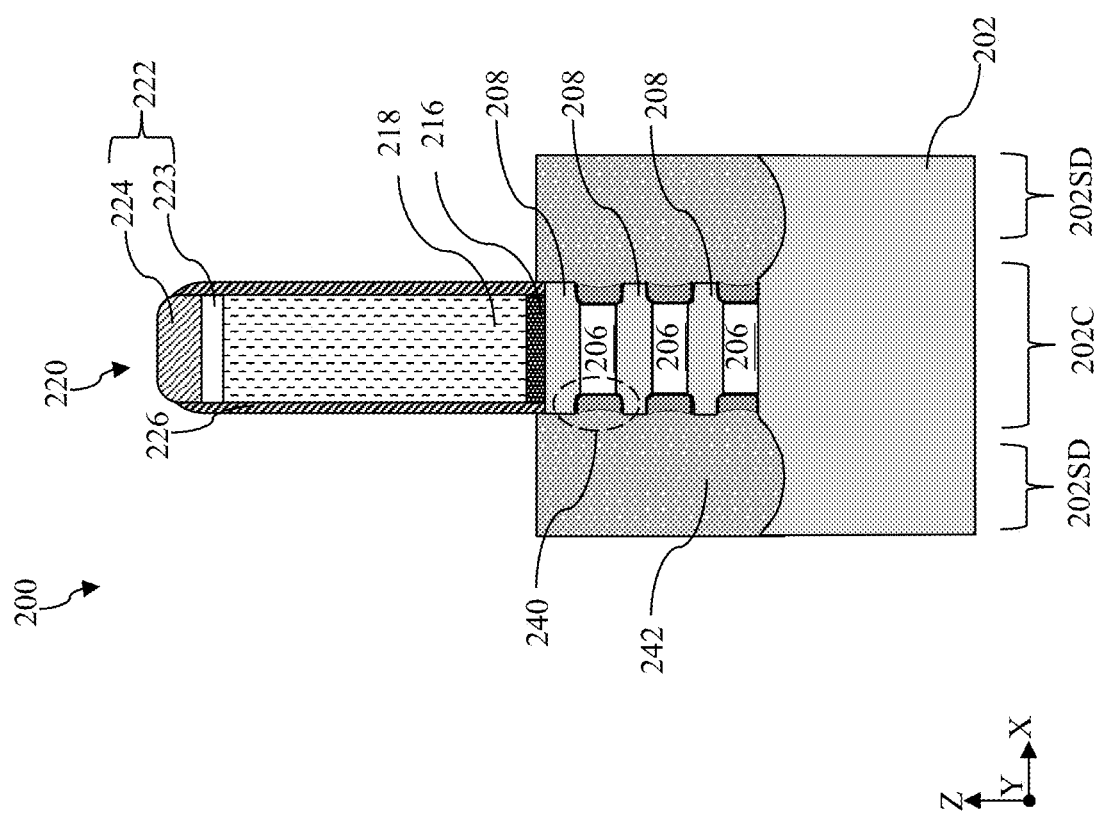

Referring to FIGS. 1 and 11, method 100 includes a block 118 where source/drain features 242 are formed in the source/drain trenches 228. In some embodiments, the source/drain features 242 may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. Depending on the conductivity type of the to-be-formed MBC transistor, the source/drain features 242 may be n-type source/drain features or p-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Example p-type source/drain features may include Si, Ge, AlGaAs, SiGe, boron-doped SiGe, or other suitable material and may be in-situ doped during the epitaxial process by introducing a p-type dopant, or ex-situ doped using an implantation process (i.e., a junction implant process).

Figure 12:
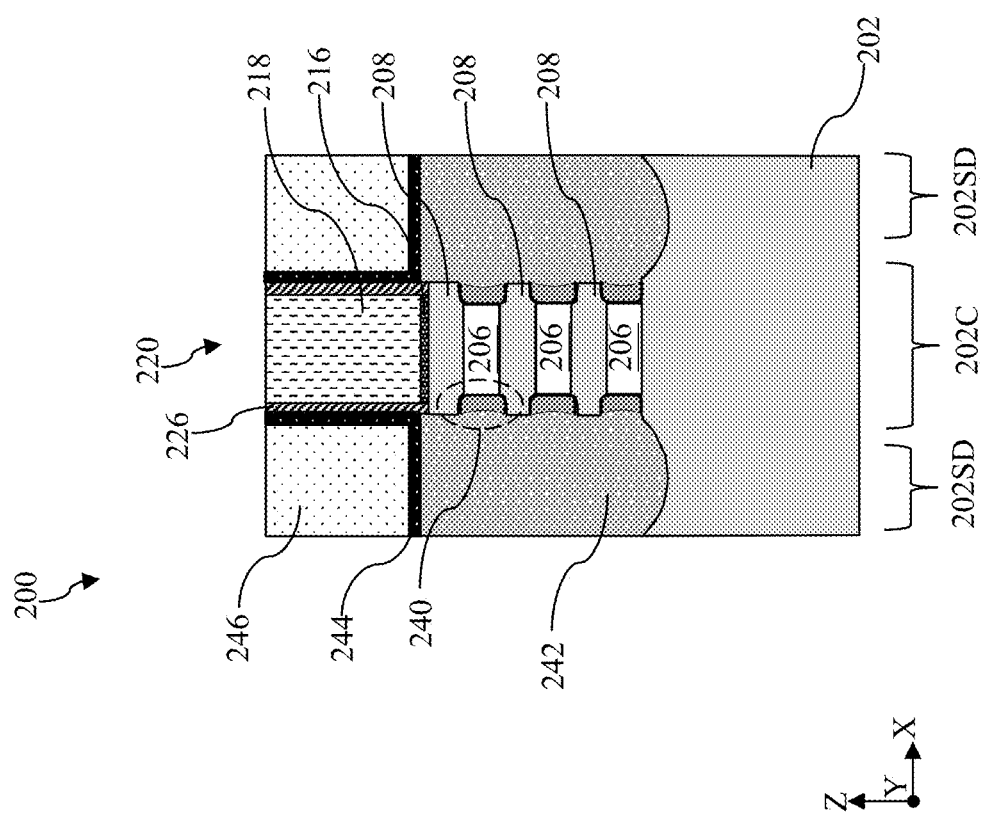

Referring to FIGS. 1 and 12, method 100 includes a block 120 where a contact etch stop layer (CESL) 244 and an interlayer dielectric (ILD) layer 246 are deposited over the workpiece 200. The CESL 244 may include silicon nitride, silicon oxide, silicon oxynitride, and/or other materials known in the art and may be formed by ALD, plasma-enhanced chemical vapor deposition (PECVD) process and/or other suitable deposition or oxidation processes. As shown in FIG. 12, the CESL 244 may be deposited on top surfaces of the source/drain features 242 and along sidewalls of the gate spacer layer 226. Although the CESL 244 is also deposited over the top surface of the gate spacer layer 226 and the gate top hard mask layer 222, FIG. 12 only illustrates cross-sectional views after the gate top hard mask layer 222 is removed. Block 120 also includes depositing of the ILD layer 246 over the CESL 244. In some embodiments, the ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique. In some embodiments, after formation of the ILD layer 246, the workpiece 200 may be annealed to improve integrity of the ILD layer 246. To remove excess materials and to expose top surfaces of the dummy gate stacks 220, a planarization process, such a chemical mechanical polishing (CMP) process may be performed, as illustrated in FIG. 12. The gate top hard mask layer 222 is removed by the planarization process.

Figure 13:
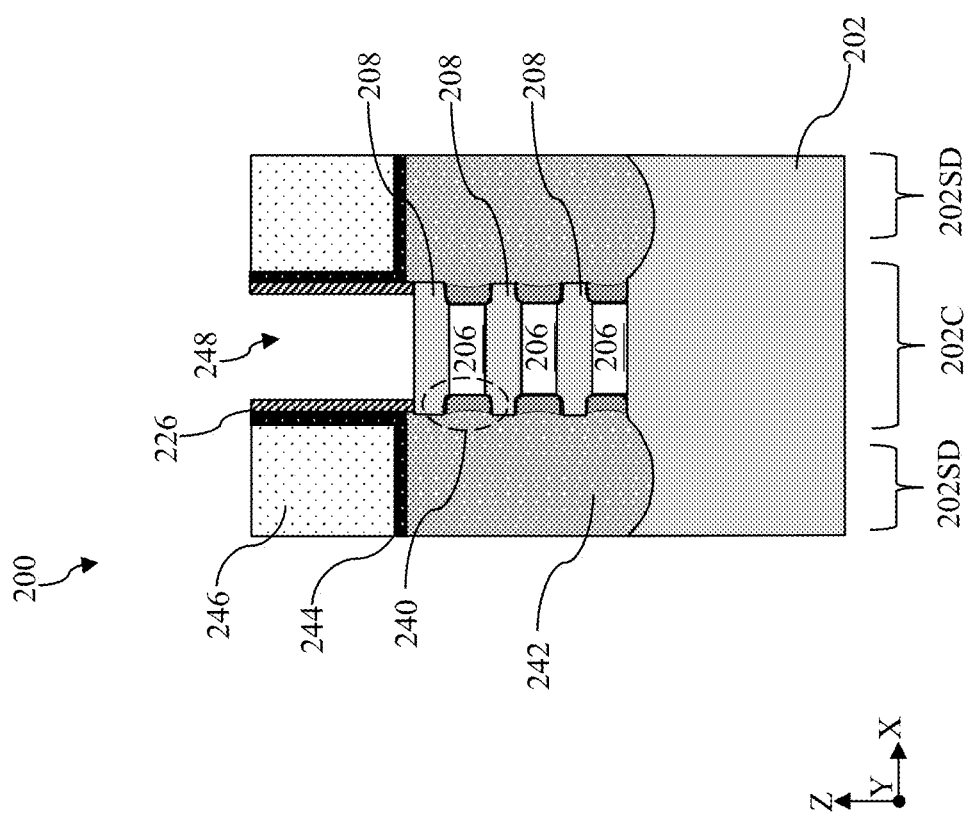

Referring to FIGS. 1 and 13, method 100 includes a block 122 where the dummy gate stack 220 is removed. In some embodiments, the removal of the dummy gate stack 220 results in a gate trench 248 over the channel regions 202C. A gate structure 250 (to be described below) may be subsequently formed in the gate trench 248, as will be described below. The removal of the dummy gate stack 220 may include one or more etching processes that are selective to the material in the dummy gate stack 220. For example, the removal of the dummy gate stack 220 may be performed using as a selective wet etch, a selective dry etch, or a combination thereof. After the removal of the dummy gate stack 220, sidewalls of the channel layers 208 and sacrificial layers 206 in the channel regions 202C are exposed in the gate trench 248.

Figure 14:
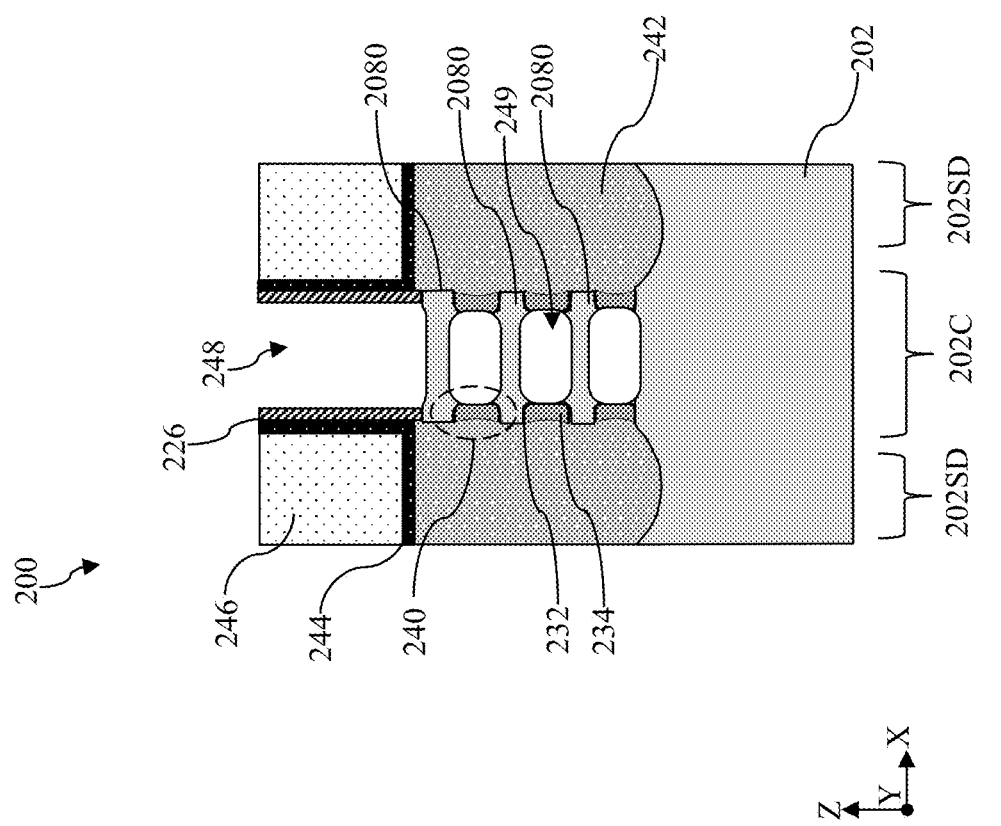

Referring to FIGS. 1 and 14, method 100 includes a block 124 where the sacrificial layers 206 in the channel region 202C are selectively removed to release the channel members 2080. After the removal of the dummy gate stack 220, block 124 of method 100 may include operations to selectively remove the sacrificial layers 206 between the channel layers 208 in the channel regions 202C. The selective removal of the sacrificial layers 206 releases the channel layers 208 to form channel members 2080. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as $NH_4OH$. As shown in FIG. 14, although the selective removal of the sacrificial layers 206 at block 124 is selective, it may still moderately etch the channel members 2080, reducing thicknesses of the channel members 2080 along the Z direction. This moderate etching of the channel members 2080 may form inter-member openings 249. When viewed along the lengthwise direction of the dummy gate stack 220 (along the Y direction), each of inter-member openings 249 has a racetrack-like shape. According to the present disclosures, the selective etching of the sacrificial layers 206 also removes the outer layer 232 adjacent the inter-member openings 249, thereby exposing the inner layer 234 in the inter-member openings 249. Operations at block 124 do not remove the portions of the outer layer 232 between the inner layer 234 and the channel members 2080. As result, the inner layer 234 remains spaced apart from the channel members 2080 by the outer layer 232.

Figure 15:
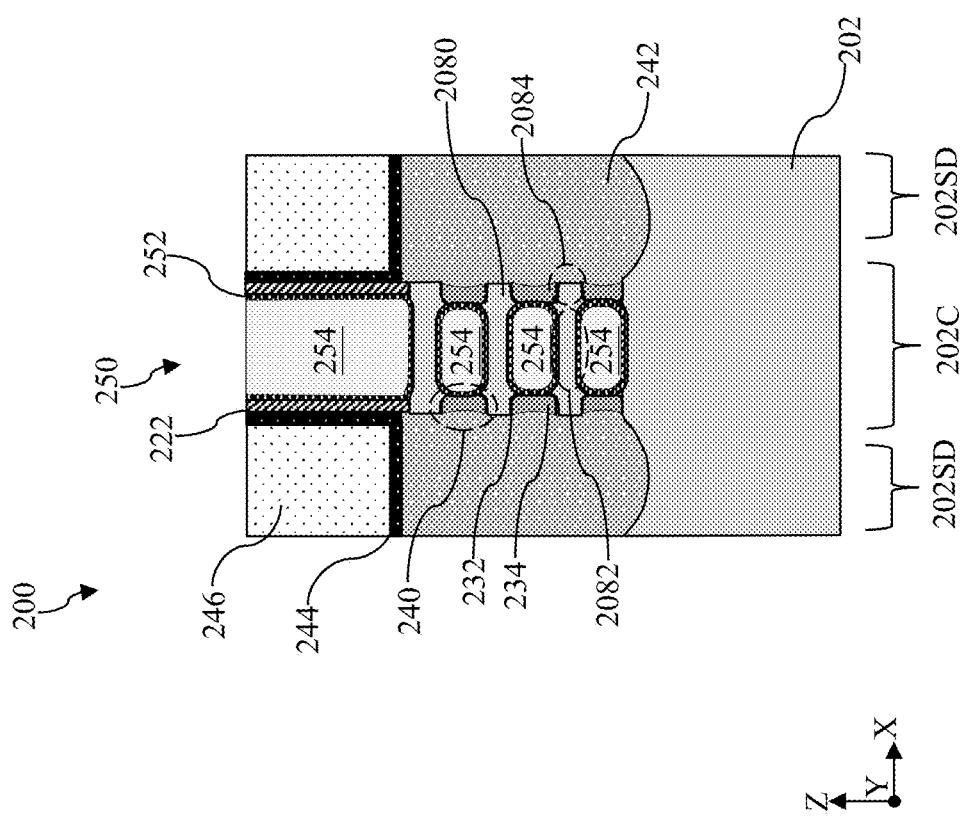

Referring to FIGS. 1 and 15, method 100 include a block 126 where a gate structure 250 is formed over and around the channel members 2080, including into the inter-member openings 249 (shown in FIG. 14). At block 126, the gate structure 250 is formed within the gate trench 248 (shown in FIG. 14) over the workpiece 200 and is deposited in the inter-member openings 249 left behind by the removal of the sacrificial layers 206 in the channel regions 202C. In this regard, the gate structure 250 wraps around each of the channel members 2080 on the Y-Z plane. In some embodiments, the gate structure 250 includes a gate dielectric layer 252 and a gate electrode 254 formed over the gate dielectric layer 252. In an example process, formation of the gate structure 250 may include deposition of the gate dielectric layer 252, deposition of the gate electrode 254, and a planarization process to remove excess material.

In some embodiments, the gate dielectric layer 252 may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, ALD, CVD, and/or other suitable method. The high-K dielectric layer may include a high-K dielectric layer such as hafnium oxide. Alternatively, the high-K dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode 254 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode 254 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode 254 may be formed by ALD, PVD, CVD, e-beam evaporation, or other suitable process. Further, the gate electrode may be formed separately for n-type transistors and p-type transistors, which may use different metal layers (e.g., for providing different n-type and p-type work function metal layers). In various embodiments, a planarization process, such as a CMP process, may be performed to remove excessive materials for both the gate dielectric layer 252 and the gate electrode 254, and thereby provide a substantially planar top surface of the gate structure 250. In some embodiments, because the inner layers 234 of the inner spacer features 240 are exposed in the inter-member openings 249 (shown in FIG. 14) and the gate structure 250 fills the inter-member openings 249, the gate structure 250 is in contact with the inner layers 234. With reference to the gate structure 250 and the inner spacer features 240, each of the channel members 2080 may be regarded as including a channel portion 2082 capped at both ends by connection portions 2084. The channel portion 2082 is wrapped around by the gate structure 250. Each of the connection portions 2084 is vertically sandwiched between two inner spacer features 240 or between the gate spacer 226 and the topmost inner spacer feature 240. Each of the connection portions 2084 connects between the source/drain feature 242 and the channel portion 2082.

Figure 16:
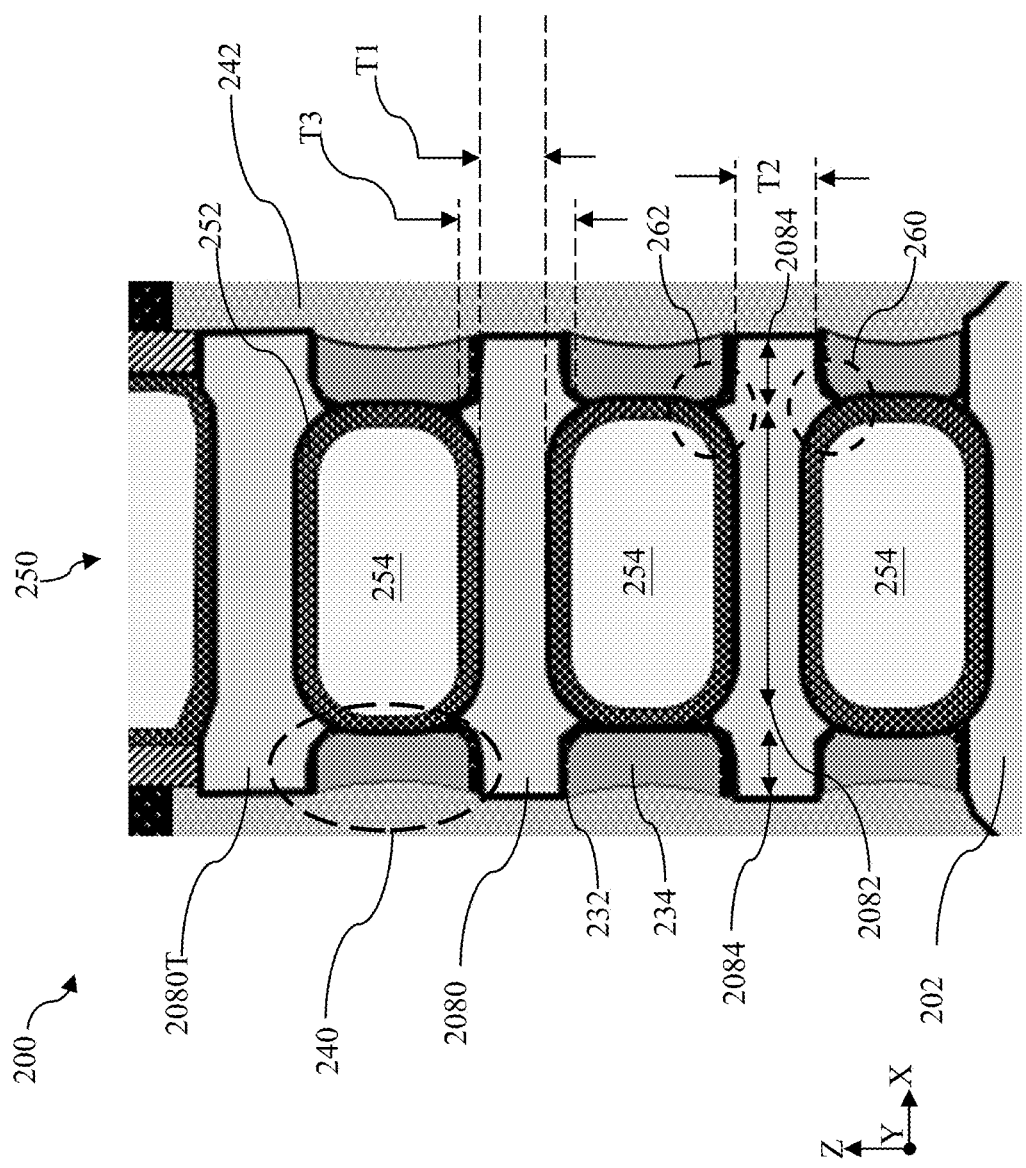
FIG. 16 illustrates an enlarged cross-sectional view of a channel region of a semiconductor device according to one or more aspects of the present disclosure.

To further illustrate features of the inner spacer features 240 and the channel members 2080 of the present disclosure, an enlarged fragmentary cross-sectional view of the channel region 202C is provided in FIG. 16. A thickness of each of the channel members 2080 of the present disclosure is not uniform throughout its length along the X direction. The channel portion 2082 of the channel member 2080 has a first thickness T1 along the Z direction and the connection portion 2084 of the channel member 2080 has a second thickness T2 along the Z direction. As illustrated in FIG. 16, the channel member 2080 may also include a bottom ridge 260 on a bottom surface of the channel member 2080 and a top ridge 262 on a top surface of the channel member 2080. The bottom ridge 260 and the top ridge 262 are disposed adjacent the interface between the inner spacer feature 240 and the gate structure 250. Put differently, the bottom ridge 260 and the top ridge 262 are disposed adjacent the interface between the channel portion 2082 and the connection portion 2084. Tips of a bottom ridge 260 and a top ridge 262 may define a third thickness T3. In some embodiments, the first thickness T1 may be substantially similar to the second thickness T2. In these embodiments, the third thickness T3 is greater than the first thickness T1 and the second thickness T2. In some instances, the first thickness T1 may be between about 5 nm and about 10 nm, the second thickness T2 may be between about 5 nm and about 10 nm, and the third thickness T3 may be between about 8 nm and about 15 nm. The bottom ridges 260 and the top ridges 262 are results of the isotropic etch that forms the inner spacer recesses 230 and the isotropic etch that selectively remove the sacrificial layers 206. The former progresses outside in and the latter progresses inside out and rounded etch edges meet at the interface between the gate structure 250 and the inner spacer features 240 to form bottom ridges 260 and the top ridges 262 shown in FIG. 16. With presence of the bottom ridges 260 and the top ridges 262, the channel member 2080 of the present disclosure may have a barbell-like shape when viewed along the lengthwise direction (i.e., the Y direction) of the gate structure 250. As shown in FIG. 16, because the connection portions of the topmost channel member 2080T are not be vertically sandwiched between two inner spacer features 240, the topmost channel member 2080T may have not have top ridges 262 and may have a different shape when viewed along the Y direction.

Although not intended to be limiting, one or more embodiments of the present disclosure provide many benefits to a semiconductor device and the formation thereof. For example, embodiments of the present disclosure provide inner spacer features that include an inner layer and an outer layer. A thickness of the outer layer is selected such that it is sufficiently thick to prevent damages to the source/drain features but is thin enough to be consumed during the channel release process. Because a dielectric constant of the outer layer is greater than a dielectric constant of the inner spacer, the removal of the outer layer may reduce parasitic capacitance. In terms of the final structure, the gate structure may be in direct contact with the inner layer. Due to extent of etching during formation of the inner spacer recesses and the removal of the sacrificial layers, channel members according to the present disclosure have bottom ridges and opposing top ridges. As a result, channel members of the present disclosure may have a barbell-like shape.

In one exemplary aspect, the present disclosure is directed to a semiconductor device. The semiconductor device includes a channel member including a first connection portion, a second connection portion and a channel portion disposed between the first connection portion and the second connection portion, a first inner spacer feature disposed over and in contact with the first connection portion, a second inner spacer feature disposed under and in contact with the first connection portion, and a gate structure wrapping around the channel portion of the channel member. The channel member further includes a first ridge on a top surface of the channel member and disposed at an interface between the channel portion and the first connection portion. The first ridge partially extends between the first inner spacer feature and the gate structure.

In some embodiments, the channel member further includes a second ridge on a bottom surface of the channel member and disposed at the interface between the channel portion and the first connection portion and the second ridge partially extends between the second inner spacer feature and the gate structure. In some embodiments, the first inner spacer feature includes an outer layer and an inner layer and a dielectric constant of the outer layer is greater than a dielectric constant of the inner layer. In some implementations, the inner layer is spaced part from the channel member by the outer layer and the inner layer is in contact with the gate structure. In some embodiments, a density of the outer layer is greater than a density of the inner layer. In some instances, the outer layer includes silicon carbonitride or silicon oxycarbonitride and the inner layer includes silicon oxycarbide, porous silicon oxycarbide, or fluorine-doped silicon oxide. In some embodiments, the outer layer and inner layer include silicon, carbon, oxygen, and nitrogen, an oxygen content of the outer layer is smaller than an oxygen content of the inner layer, and a nitrogen content of the outer layer is greater than a nitrogen content of the inner layer. In some implementations, the oxygen content of the outer layer is between about 5% and about 15%, the oxygen content of the inner layer is between about 40% and about 60%, the nitrogen content of the outer layer is between about 40% and about 60%, and the nitrogen content of the inner layer is between about 10% and about 20%.

In another exemplary aspect, the present disclosure is directed to a semiconductor device. The semiconductor device includes a channel member including a first connection portion, a second connection portion and a channel portion disposed between the first connection portion and the second connection portion along a first direction, a first source/drain feature in contact with the first connection portion, a second source/drain feature in contact with the second connection portion, a first inner spacer feature disposed over the first connection portion along a second direction perpendicular to the first direction, a second inner spacer feature disposed below the first connection portion along the second direction, and a gate structure wrapping around the channel portion of the channel member. The first inner spacer feature includes an outer layer and an inner layer, the inner layer is spaced part from the channel member by the outer layer, and the inner layer is in contact with the gate structure.

In some embodiments, the first inner spacer feature has a first dimension along the first direction and a second dimension along the second direction and the first dimension is smaller than the second dimension. In some embodiments, the channel member further includes a first ridge on a top surface of the channel member and disposed at an interface between the channel portion and the first connection portion. The channel member further includes a second ridge on a bottom surface of the channel member and disposed at the interface between the channel portion and the first connection portion. The first ridge partially extends between the first inner spacer feature and the gate structure and the second ridge partially extends between the second inner spacer feature and the gate structure. In some implementations, a dielectric constant of the outer layer is greater than a dielectric constant of the inner layer. In some implementations, a density of the outer layer is greater than a density of the inner layer. In some embodiments, the outer layer includes silicon carbonitride or silicon oxycarbonitride and the inner layer includes silicon oxycarbide, porous silicon oxycarbide, or fluorine-doped silicon oxide. In some instances, the outer layer and inner layer include silicon, carbon, oxygen, and nitrogen, an oxygen content of the outer layer is smaller than an oxygen content of the inner layer, and a nitrogen content of the outer layer is greater than a nitrogen content of the inner layer. In some implementations, the oxygen content of the outer layer is between about 5% and about 15%, the oxygen content of the inner layer is between about 40% and about 60%, the nitrogen content of the outer layer is between about 40% and about 60%, and the nitrogen content of the inner layer is between about 10% and about 20%.

In yet another exemplary aspect, the present disclosure is directed to a method of fabricating a semiconductor device. The method includes receiving a workpiece that includes a substrate and a stack over the substrate, the stack having a plurality of channel layers interleaved a plurality of sacrificial layers, patterning the stack and the substrate to form a fin-shaped structure, forming a dummy gate stack over a channel region of the fin-shaped structure while source/drain regions of the fin-shaped structure are exposed, recessing the source/drain regions to form source/drain trenches and to expose sidewalls of the plurality of channel layers and the plurality of sacrificial layers, selectively and partially etching the plurality of sacrificial layers to form inner spacer recesses, depositing a first inner spacer material layer in the inner spacer recesses, depositing a second inner spacer material layer over the first inner spacer material layer, etching back the first inner spacer material layer and the second inner spacer material layer to form inner spacer features in the inner spacer recesses, wherein each of the inner spacer features includes an outer layer formed from the first inner spacer material layer and an inner layer formed from the second inner spacer material layer, removing the dummy gate stack to expose sidewalls of the sidewalls of the plurality of channel layers and the plurality of sacrificial layers in the channel region, selectively etching the plurality of sacrificial layers to release the plurality of channel layers in the channel region, and forming a gate structure to wrap around each of the channel layers. The selectively etching includes etching the outer layer and the gate structure is in contact with the inner layer.

In some embodiments, a thickness of the first inner spacer material layer is smaller than a thickness of the second inner spacer material layer. In some implementations, the depositing of the first inner spacer material layer and the depositing of the second inner spacer material layer include use of atomic layer deposition (ALD) and the first inner spacer material layer and the second inner spacer material layer include silicon, carbon, oxygen, and nitrogen. In some instances, an oxygen content of the first inner spacer material layer is between about 5% and about 15%, an oxygen content of the second inner spacer material layer is between about 40% and about 60%, a nitrogen content of the first inner spacer material layer is between about 40% and about 60%, and a nitrogen content of the second inner spacer material layer is between about 10% and about 20%.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a nanostructure including a first connection portion, a second connection portion and a channel portion disposed between the first connection portion and the second connection portion;

a first inner spacer feature disposed over and in contact with the first connection portion;

a second inner spacer feature disposed under and in contact with the first connection portion; and a gate structure wrapping around the channel portion of the nanostructure, wherein the nanostructure further comprises a first ridge extending upward along a vertical direction from an interface between the channel portion and the first connection portion.

2. The semiconductor structure of claim 1, wherein the first ridge partially extends between the first inner spacer feature and the gate structure.

3. The semiconductor structure of claim 1, wherein the nanostructure further comprises a second ridge extending downward along the vertical direction from the interface between the channel portion and the first connection portion, wherein the second ridge partially extends between the second inner spacer feature and the gate structure.

4. The semiconductor structure of claim 1, wherein the first inner spacer feature comprises an outer layer and an inner layer, wherein the outer layer is spaced part from the nanostructure along the vertical direction by the inner layer.

5. The semiconductor structure of claim 4, wherein a dielectric constant of the inner layer is greater than a dielectric constant of the outer layer.

6. The semiconductor structure of claim 4, wherein the outer layer is spaced part from the gate structure by the inner layer, where the inner layer is in contact with the gate structure.

7. The semiconductor structure of claim 4, wherein a density of the inner layer is greater than a density of the outer layer.

8. The semiconductor structure of claim 4, wherein the inner layer comprises silicon carbonitride or silicon oxycarbonitride, wherein the outer layer comprises silicon oxycarbide, porous silicon oxycarbide, or fluorine-doped silicon oxide.

9. The semiconductor structure of claim 4, wherein the outer layer and inner layer comprise silicon, carbon, oxygen, and nitrogen, wherein an oxygen content of the inner layer is smaller than an oxygen content of the outer layer, wherein a nitrogen content of the inner layer is greater than a nitrogen content of the outer layer.

10. The semiconductor structure of claim 9, wherein the oxygen content of the inner layer is between about 5% and about 15%, wherein the oxygen content of the outer layer is between about 40% and about 60%, wherein the nitrogen content of the inner layer is between about 40% and about 60%, wherein the nitrogen content of the outer layer is between about 10% and about 20%.

11. A semiconductor structure, comprising:

a first source/drain feature and a second source/drain feature;

a first nanostructure and a second nanostructure extending between the first source/drain feature and the second source/drain feature along a first direction, the second nanostructure being disposed over the first nanostructure along a second direction perpendicular to the first direction;

a gate structure wrapping around each of the first and second nanostructures; and a first inner spacer feature disposed between the first nanostructure and the second nanostructure, the first inner spacer feature being adjacent the gate structure; and a second inner spacer feature disposed over the second nanostructure and adjacent the gate structure, wherein the second nanostructure include a top ridge disposed adjacent an interface between the gate structure and the second inner spacer feature, wherein the second nanostructure further includes a bottom ridge disposed between an interface between the gate structure and the first inner spacer feature.

12. The semiconductor structure of claim 11, wherein the top ridge partially extends between the second inner spacer feature and the gate structure along the first direction, wherein the bottom ridge partially extends between the first inner spacer feature and the gate structure along the first direction.

13. The semiconductor structure of claim 11, wherein the gate structure wraps around a channel region of the second nanostructure, wherein a tip of the top ridge and a top of the bottom ridge define a first thickness, wherein the channel region of the second nanostructure comprises a second thickness smaller than the first thickness.

14. The semiconductor structure of claim 11, wherein the first inner spacer feature comprises an outer layer and an inner layer, wherein the outer layer is spaced part from the first nanostructure by the inner layer, where the inner layer is in contact with the gate structure.

15. The semiconductor structure of claim 11, wherein the first inner spacer feature has a first dimension along the first direction and a second dimension along the second direction, wherein the first dimension is smaller than the second dimension.

16. A semiconductor structure, comprising:

a first nanostructure including a first connection portion, a second connection portion and a first channel portion disposed between the first connection portion and the second connection portion along a first direction;

a gate spacer feature disposed over and in contact with the first connection portion;

an first inner spacer feature disposed under and in contact with the first connection portion; and a gate structure wrapping around the first channel portion of the first nanostructure, wherein the first nanostructure further comprises a first bottom ridge extending downward along a second direction from an interface between the gate structure and the first inner spacer feature.

17. The semiconductor structure of claim 16, wherein the first nanostructure is free of any top ridge extending from a top surface of the first nano structure.

18. The semiconductor structure of claim 16, further comprising:

a second nanostructure disposed below the first nanostructure and including a third connection portion, a fourth connection portion and a second channel portion disposed between the third connection portion and the fourth connection portion along the first direction, wherein the gate structure wraps around the second channel portion of the second nanostructure.

19. The semiconductor structure of claim 18, further comprising:
a second inner spacer feature disposed under and in contact with the third connection portion,
wherein the second nanostructure further comprises a first top ridge extending upward from an interface between the gate structure and the first inner spacer feature.

20. The semiconductor structure of claim 19, wherein the second nanostructure further comprises a second bottom ridge extending downward from an interface between the gate structure and the second inner spacer feature.

* * * * *